(12) United States Patent
Bruner et al.

(10) Patent No.: US 7,966,539 B2
(45) Date of Patent: *Jun. 21, 2011

(54) DIGITAL CONTENT PROTECTION SYSTEMS AND METHODS (75) Inventors: Curtis H. Bruner, Longmont, CO (US); Christopher J. Squires, Westminster, CO (US); Jeffrey G. Reh, Longmont, CO (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

This patent is subject to a terminal disclaimer.

(21) Appl. No.: 12/492,433

(22) Filed: Jun. 26, 2009

(65) Prior Publication Data
US 2009/0259914 A1 Oct. 15, 2009

Related U.S. Application Data (63) Continuation of application No. 11/340,099, filed on Jan. 26, 2006, now Pat. No. 7,571,368.

(51) Int. Cl.
*H03M 13/00* (2006.01)
(52) U.S. Cl. .................. 714/746; 714/757; 714/781
(58) Field of Classification Search .............. 714/746, 714/757, 781, 763, 742
See application file for complete search history.

(56) References Cited

U.S. PATENT DOCUMENTS

| | | | |
|---|---|---|---|
| 3,916,112 A | 10/1975 | Kalat et al. | |
| 5,109,393 A | 4/1992 | Saegusa | |
| 5,321,828 A | 6/1994 | Phillips et al. | |
| 5,355,412 A | 10/1994 | Kangas | |
| 5,388,156 A | 2/1995 | Blackledge, Jr. et al. | |
| 5,430,738 A | 7/1995 | Tsuda | |
| 5,461,674 A | 10/1995 | Citta | |
| 5,721,778 A | 2/1998 | Kubota et al. | |
| 5,721,873 A | 2/1998 | Tobita et al. | |
| 5,729,987 A * | 3/1998 | Miller | 62/98 |
| 5,818,873 A | 10/1998 | Wall et al. | |
| 5,854,938 A | 12/1998 | Ogi | |
| 5,870,475 A | 2/1999 | Allan et al. | |
| 5,925,144 A | 7/1999 | Sebaa | |
| 5,949,877 A | 9/1999 | Traw et al. | |
| 5,982,899 A | 11/1999 | Probst | |
| 6,012,146 A | 1/2000 | Liebenow | |
| 6,201,811 B1 | 3/2001 | Larsson et al. | |

(Continued)

FOREIGN PATENT DOCUMENTS

EP 0593305 4/1994

OTHER PUBLICATIONS

Microsoft, "Trusted Platform Module Services in Windows Longhorn," Apr. 25, 2005, pp. 1-10, WinHEC 2005 Version, Microsoft Corporation.

(Continued)

*Primary Examiner* — Fritz Alphonse (57) ABSTRACT

A method of operating an integrated circuit which includes an input module, an output module, and a processing module coupled to the input module and the output module. The method includes, in the input module, receiving a first data segment; in the processing module, reading a hard coded identifier from an identifier module coupled to the processing module, processing the first data segment with the hard coded identifier to generate a first encoded data segment; and in the output module, transferring the first encoded data segment for storage on a storage system.

15 Claims, 5 Drawing Sheets

U.S. PATENT DOCUMENTS

| | | | |
|---|---|---|---|
| 6,229,712 B1 | 5/2001 | Munoz-Bustamante et al. |
| 6,252,961 B1 | 6/2001 | Hogan |
| 6,529,727 B1 | 3/2003 | Findikli et al. |
| 6,601,175 B1 | 7/2003 | Arnold et al. |
| 6,668,246 B1 | 12/2003 | Yeung et al. |
| 6,895,504 B1 | 5/2005 | Zhang et al. |
| 6,918,036 B1 | 7/2005 | Drews |
| 6,969,872 B2 | 11/2005 | Kim |
| 6,969,892 B2 | 11/2005 | Matsumoto |
| 7,299,399 B2 | 11/2007 | Huang |
| 7,313,824 B1 | 12/2007 | Bala et al. |
| 7,353,542 B2 | 4/2008 | Shiga et al. |
| 7,356,756 B1 | 4/2008 | Chan et al. |
| 7,487,363 B2 | 2/2009 | Alve et al. |
| 7,502,470 B2 | 3/2009 | Hanko et al. |
| 2002/0044657 A1 | 4/2002 | Asano et al. |
| 2002/0059539 A1 | 5/2002 | Anderson |
| 2002/0141578 A1 | 10/2002 | Ripley et al. |
| 2003/0070099 A1 | 4/2003 | Schwartz et al. |
| 2003/0084316 A1 | 5/2003 | Schwartz |
| 2003/0120918 A1 | 6/2003 | VanDer Kamp |
| 2003/0161473 A1 | 8/2003 | Fransdonk |
| 2003/0174844 A1 | 9/2003 | Candelore |
| 2003/0202199 A1 | 10/2003 | Carter et al. |
| 2003/0212911 A1 | 11/2003 | Challener et al. |
| 2004/0111613 A1 | 6/2004 | Shen-Orr et al. |
| 2004/0172369 A1 | 9/2004 | Persson |
| 2004/0181303 A1 | 9/2004 | Walmsley |
| 2004/0250104 A1 | 12/2004 | Handa et al. |
| 2005/0033972 A1 | 2/2005 | Watson |
| 2005/0108525 A1 | 5/2005 | Nason et al. |
| 2006/0242068 A1 | 10/2006 | Jogand-Coulomb et al. |
| 2007/0106842 A1 | 5/2007 | Conley et al. |
| 2007/0168292 A1 | 7/2007 | Jogand-Coulomb et al. |
| 2007/0168564 A1 | 7/2007 | Conley et al. |

OTHER PUBLICATIONS

Subdeep Bajikar, "Trusted Platform Module (TPM) based Security on Notebook PCs—White Paper," Mobile Platforms Group, Jun. 20, 2002, pp. 1-20, Intel Corporation.

* cited by examiner

DIGITAL CONTENT PROTECTION SYSTEMS AND METHODS

RELATED APPLICATIONS

This patent application is a continuation of and claims priority to patent application Ser. No. 11/340,099; filed Jan. 26, 2006; entitled "DIGITAL CONTENT PROTECTION SYSTEMS AND METHODS", now U.S. Pat. No. 7,571,368 and which is hereby incorporated by reference into this patent application.

FEDERALLY SPONSORED RESEARCH OR DEVELOPMENT

Not applicable

MICROFICHE APPENDIX

Not applicable

BACKGROUND OF THE INVENTION

1. Field of the Invention

The invention relates to digital content protection technologies, and in particular, to protecting digital content by linking stored content to particular host systems.

2. Description of the Prior Art

The importance of digital content protection has increased as the widespread distribution and use of digital content has become more common. Both content providers and end users desire to control how and when digital content is accessed and used. As electronic devices, such as personal computers, phones, music devices, and video devices, have proliferated, so has the need for improved digital content protection.

In the prior art, many software and hardware based techniques have been utilized to protect digital content. For example, digital content is often times processed using a software or hardware process executed on the host system portion of a device to encrypt or otherwise encode the content. The protected content is then transferred to the storage system portion of the device, or to a removable storage element, for storage. Upon retrieving the content from storage, the content is typically decrypted or decoded on the host system by the software or hardware process.

One problem with content protection solutions in the prior art is that, even if content can be strongly encrypted or encoded, many storage systems can be easily ported to new host systems. As a result, the encrypted content stored on the ported storage system can be accessed and the encryption eventually defeated. In one example, porting digital content to a new host system may be contrary to the wishes of a content provider. In another example, porting content to a new host system may be contrary to the wishes of an end user. Thus, a solution is needed to efficiently and cost effectively link stored digital content to particular host systems.

SUMMARY OF THE INVENTION

What is disclosed is an integrated circuit. The integrated circuit includes an input module configured to receive a first data segment, an identifier module having a hard coded identifier, a processing module coupled to the input module and coupled to the identifier module and configured to process the first data segment with the hard coded identifier to generate a first encoded data segment, and an output module configured to transfer the first encoded data segment for storage on a storage system.

What is also disclosed is a method of operating an integrated circuit which includes an input module, an output module, and a processing module coupled to the input module and the output module. The method includes, in the input module, receiving a first data segment; in the processing module, reading a hard coded identifier from an identifier module coupled to the processing module, processing the first data segment with the hard coded identifier to generate a first encoded data segment; and in the output module, transferring the first encoded data segment for storage on a storage system.

What is also disclosed is a device. The device includes a storage medium and a host system having a plurality of system elements and a storage control system for controlling data transfer between the plurality of system elements and the storage medium. The storage control system includes a content protection system configured to receive a first data segment from a one of the plurality of system elements, read a hard coded identifier, process the first data segment with the hard coded identifier to generate a first encoded data segment, and transfer the first encoded data segment for storage on the storage medium. The storage control system also includes a transfer system configured to transfer the first encoded data segment to the storage medium.

BRIEF DESCRIPTION OF THE DRAWINGS

The same reference number represents the same element on all drawings.

DETAILED DESCRIPTION OF THE PREFERRED EMBODIMENT

FIGS. 1-5 and the following description depict specific embodiments of the invention to teach those skilled in the art how to make and use the best mode of the invention. For the purpose of teaching inventive principles, some conventional aspects have been simplified or omitted. Those skilled in the art will appreciate variations from these embodiments that fall within the scope of the invention. Those skilled in the art will appreciate that the features described below can be combined in various ways to form multiple embodiments of the invention. As a result, the invention is not limited to the specific embodiments described below, but only by the claims and their equivalents.

Figure 1:
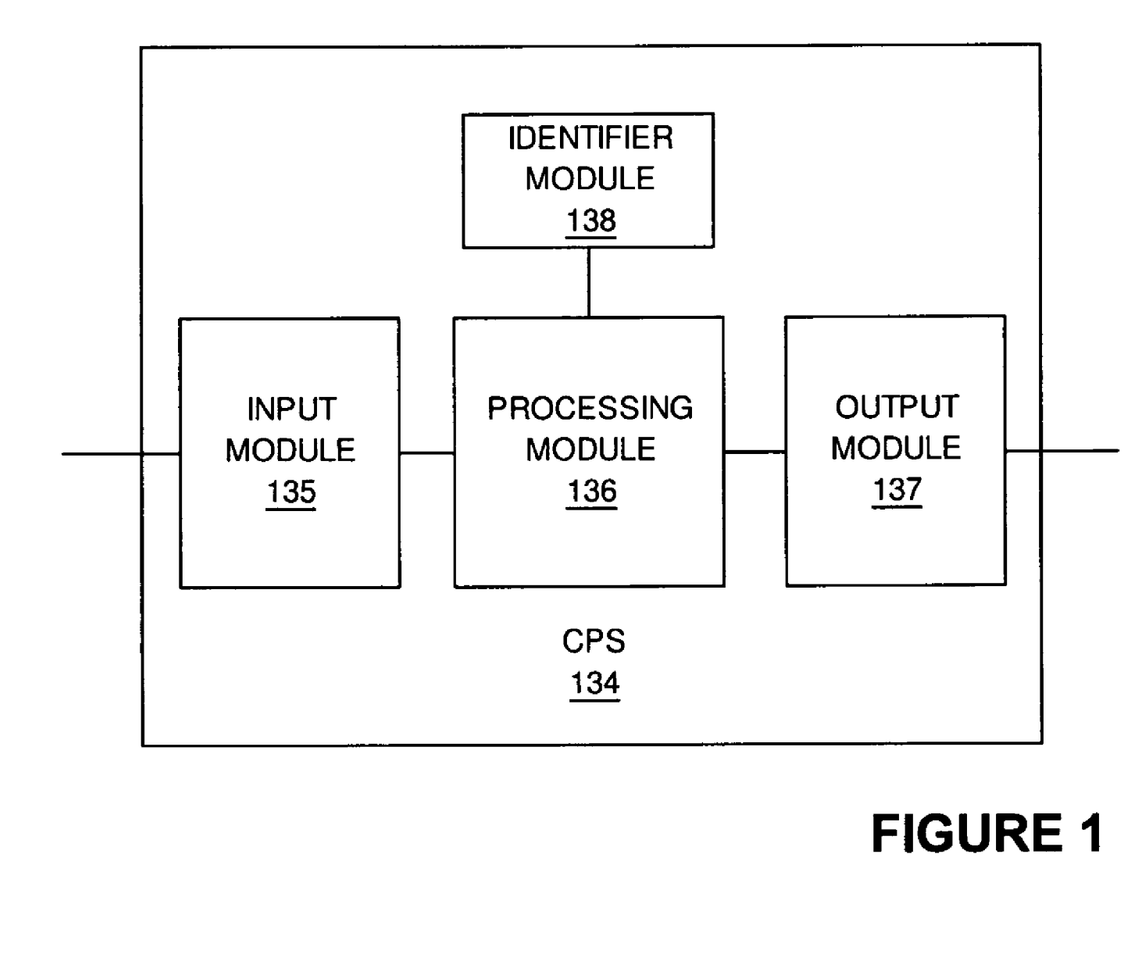
FIG. 1 illustrates a content protection system in an embodiment of the invention.

FIG. 1 illustrates a functional block diagram of content protection system (CPS) 134 in an embodiment of the invention. In this embodiment, digital content is processed and stored in a manner so as to link the stored content to a particular host system. When content is retrieved from a storage system by a host system, the retrieval could succeed if the host system is the same host system that initially provided the content to the storage system for storage. If not, the retrieval process could fail.

In particular, data segments of digital content are processed by a content protection system using a hard coded identifier to seed an error correction code (ECC) process. Each hard coded identifier is preferably unique to each content protection system, and therefore to each host system and device. Each data segment is stored on a storage system, along with the associated ECC. When the digital content is retrieved from storage, each ECC is processed with the corresponding data segment to produce a result. The result is checked against the hard coded identifier. The differences between the result and the hard coded identifier are used to correct errors in the data segment.

In a successful case, such as when the retrieving host system is the same host system that initially provided the content, the data segment could be corrected appropriately and the corrected data segment provided to other host system elements for further data processing. In an unsuccessful case, such as when the retrieving host system is not the same host system that initially provided the content, the data segment could be erroneously corrected, resulting in invalid or unintelligible data.

Turning to FIG. 1, CPS 134 includes input module 135, processing module 136, output module 137, and identifier module 138. CPS 134 could be a semiconductor based integrated circuit and could also be referred to as a microchip or chip. It should be understood that CPS 134 could be a stand alone system. Alternatively, CPS 134 could be integrated as a subsystem of another integrated circuit. As illustrated by FIG. 1, processing module 136 is operatively coupled to input module 135. Processing module 136 is also operatively coupled to output module 137 and identifier module 138. It should be understood that other elements could be included with CPS 134.

Identifier module 138 could comprise one or more inputs connected to processing module 136. The inputs could be, for example, electrical inputs, such as voltage or current inputs, as well as pins or fuses. The inputs could be set during the manufacturing process to a predetermined identifier. The identifier could be, for instance, a binary identifier. As is well known in the art, semiconductor masks are used in the integrated circuit manufacturing process to create various circuit patterns on each layer of a microchip. In one example, a unique identifier could be defined on an integrated circuit mask or a set of masks. Each microchip produced by the manufacturing process could have a unique identifier that differs from device to device. The unique identifier is connected directly to processing module 136. In one embodiment, the identifier could be accessible only to processing module 136, and inaccessible to any other system elements, such as memory registers or bus systems.

Figure 2:
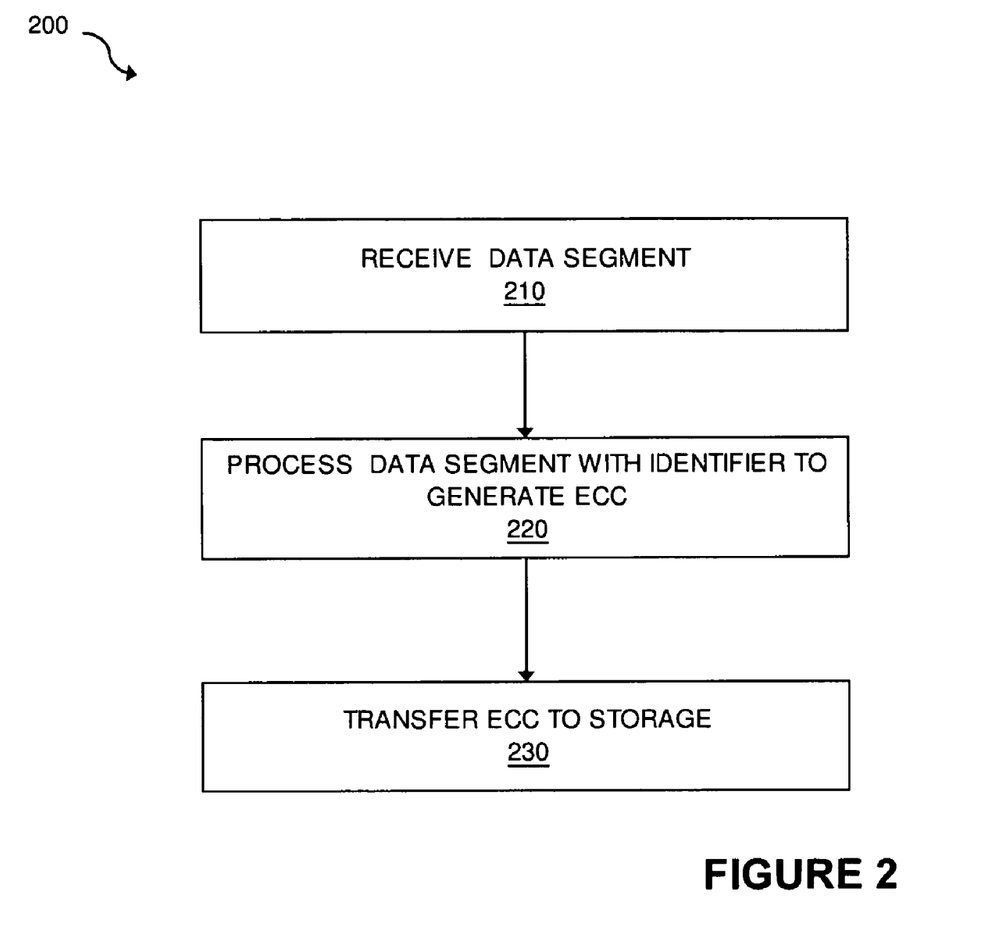
FIG. 2 illustrates the operation of a content protection system in an embodiment of the invention.

FIG. 2 illustrates storage process 200 describing the operation of CPS 134 in an embodiment of the invention. In this embodiment, data is transferred to CPS 134 for ECC generation using the hard coded identifier of identifier module 138. It should be understood that ECC processes are well known in the art. The resulting ECC is stored on a storage medium, such as a disk drive or flash memory. Oftentimes, the ECC is stored along with the subject data segment.

To begin, input module 135 receives a data segment from a host system element for storage on a storage system (Step 210). The data segment could be a portion of a larger data set, such as text, music, or video files. Processing module 136 reads the data segment and processes the data segment with the hard coded identifier from identifier module 138 to generate an error correction code (ECC) (Step 220). Processing module 136 passes the resulting ECC to output module 137 (Step 230). Output module 137 transfers the ECC for storage with the data segment.

Figure 3:
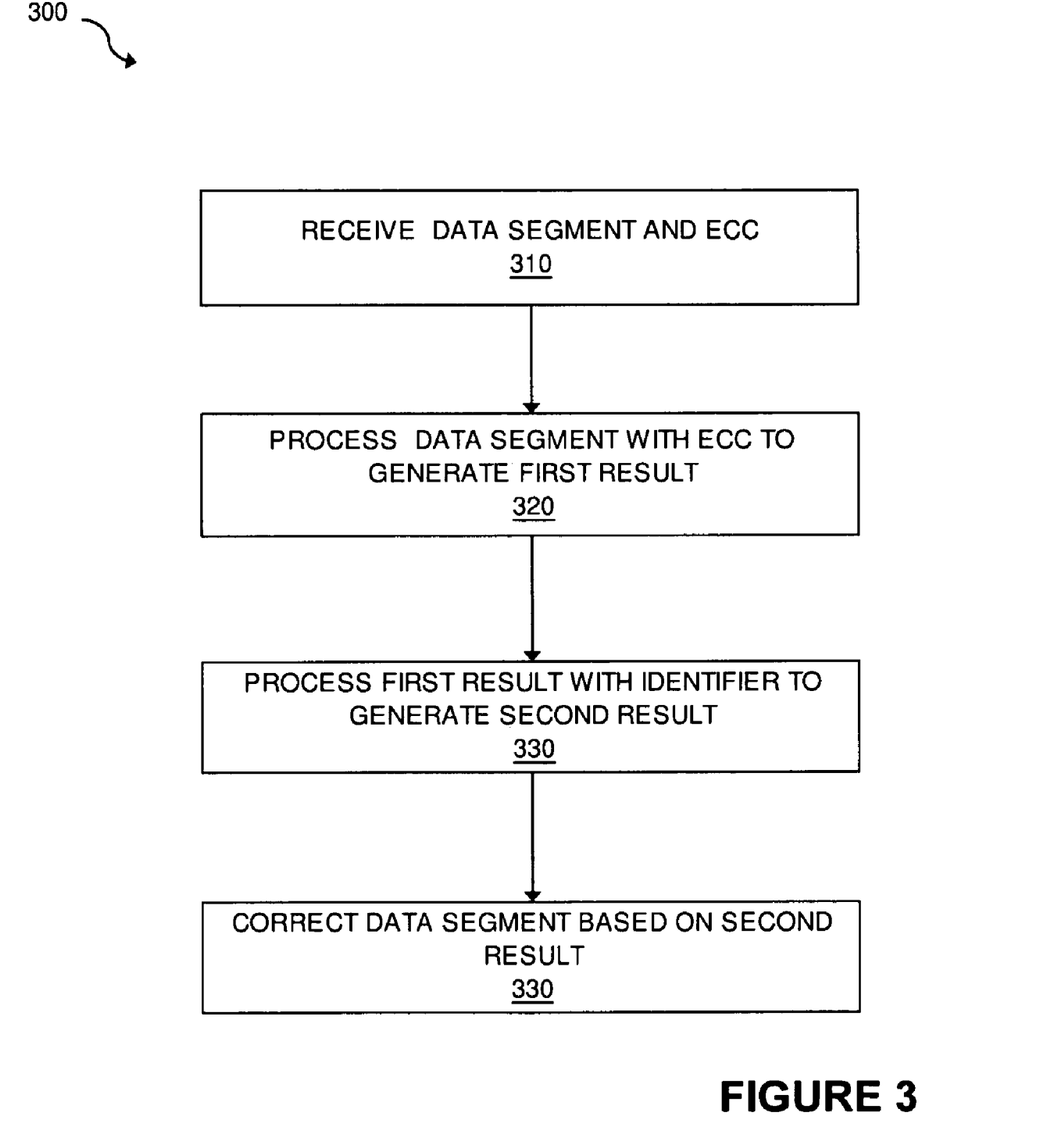
FIG. 3 illustrates the operation of a content protection system in an embodiment of the invention.

FIG. 3 illustrates retrieval process 300 describing the operation of CPS 134 in an embodiment of the invention. In this embodiment, data is transferred from a storage system to CPS 134 for error correction purposes. Using the hard coded identifier of identifier module 138, CPS 134 is configured to correct any errors in the data segment being retrieved. Assuming CPS 134 is the same CPS that initially generated the ECC that is stored with the target data segment, the error correction process could proceed normally and the resulting data could be provided in a useful condition to other elements of the host system.

In a case wherein CPS 134 is not the same CPS that initially generated the ECC that is stored with the target data segment, the data segment could appear to have more errors than in the previous case. The error correction process could therefore miscorrect the data segment, thereby corrupting the subject data. The resulting data could either be provided in a damaged condition to other elements of the host system, or the data transfer process could cease entirely.

Turning to FIG. 3, input module 135 receives the data segment and associated ECC from storage (Step 310). Processing module 136 reads and processes the data segment with the ECC to generate a first result (Step 320). Next, processing module 136 processes the first result with the hard coded identifier from identifier module 138 to generate a second result (Step 330). The second result identifies errors in the data segment. Processing module 136 then corrects the data segment based on the second result (Step 340). As discussed above, if the hard coded identifier is the same identifier used to initially generate the ECC during the storage process, the error correction process could work correctly and the resulting data could be provided to host system elements in a useful form. If the hard coded identifier is not the same identifier used to initially generate the ECC during the storage process, the error correction process could further damage the data. The resulting data could be damaged and unintelligible.

Figure 4:
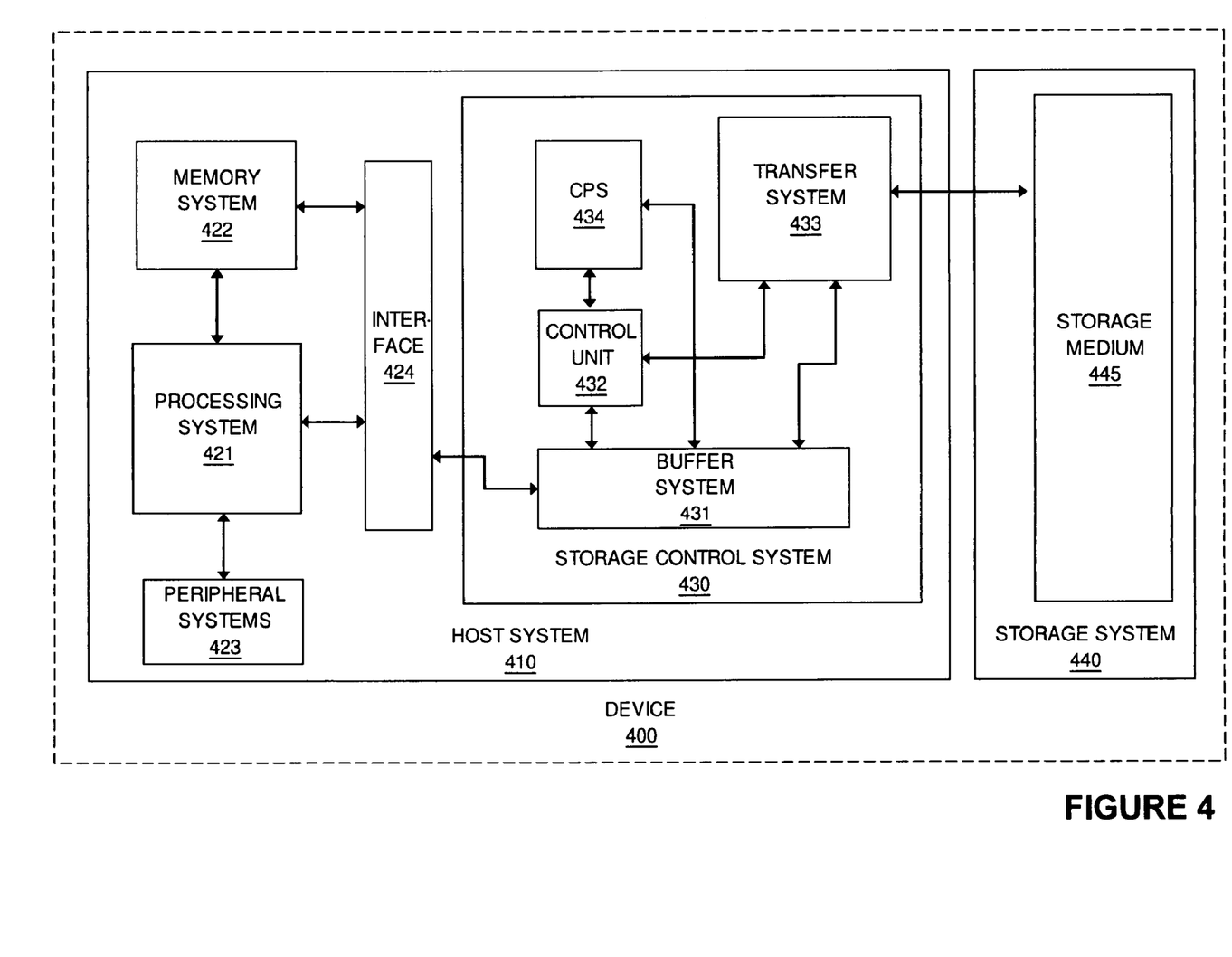
FIG. 4 illustrates a device in an embodiment of the invention.

It should be understood that CPS 134 could be implemented in an electronics device, such as a cell phone, audio player, video player, game machine, or personal computing device, as well as other types of electronics devices. In one example, FIG. 4 illustrates a functional block diagram of a device 400 having a content protection system 434 configured to operate as described for CPS 134. Device 400 includes host system 410 and storage system 440. Host system 410 includes storage control system 430, processing system 421, peripheral systems 423, memory system 422, and interface 424. Storage control system 430 includes buffer system 431, control unit 432, transfer system 433, and CPS 434. Storage system 440 includes storage medium 445.

In this embodiment, peripheral systems 423 are operatively coupled to processing system 421. Processing system 421 is operatively coupled to peripheral systems 423, memory system 422, and interface 424. Processing system 421 could be, for instance, a central processing unit. Memory system 422 is operatively coupled to processing system 421 and interface 424. Memory system 422 could be, for example, general purpose random access memory. Interface 424 could be a logical or physical interface, or both.

In operation, storage control system 430 controls the transfer of data to and from storage system 440. Control unit 432 is operatively coupled to buffer system 431, CPS 434, and transfer system 433. CPS 434 is operatively coupled to control unit 432 and buffer system 431. While not pictured, CPS 434 could be operatively coupled to interface 424. Similarly, control unit 432 could be operatively coupled to interface 424. Control unit 432 typically controls and coordinates the operations of the elements of storage control system 430. Other control units are possible. Buffer system 431 is operatively coupled to control unit 432, interface 424, and transfer system 433. Transfer system 433 is operatively coupled to control unit 432, buffer system 431, and storage medium 445.

Typically, operating system and application type programs are executed on host system 410 by processing system 421. In conjunction with the programs, data is transferred between host system 410 and storage system 440. The transfer protocols involved in data transfer are well known in the art. In a write scenario, data segments are transferred from memory system 422 over interface 424 to buffer system 431. CPS 434 reads a data segment from buffer system 431 and processes the data segment with a hard coded identifier to generate an ECC. CPS 434 then returns the ECC to buffer system 431. Buffer system 431 provides the ECC, along with the data segment, to transfer system 433. Transfer system 433 writes the ECC and data segment to memory on storage medium 445. The data segment stored on storage system 440 is thus bonded to host system 410 because the ECC associated with the data segment was generated using an inaccessible, hardwired identifier.

Figure 5:
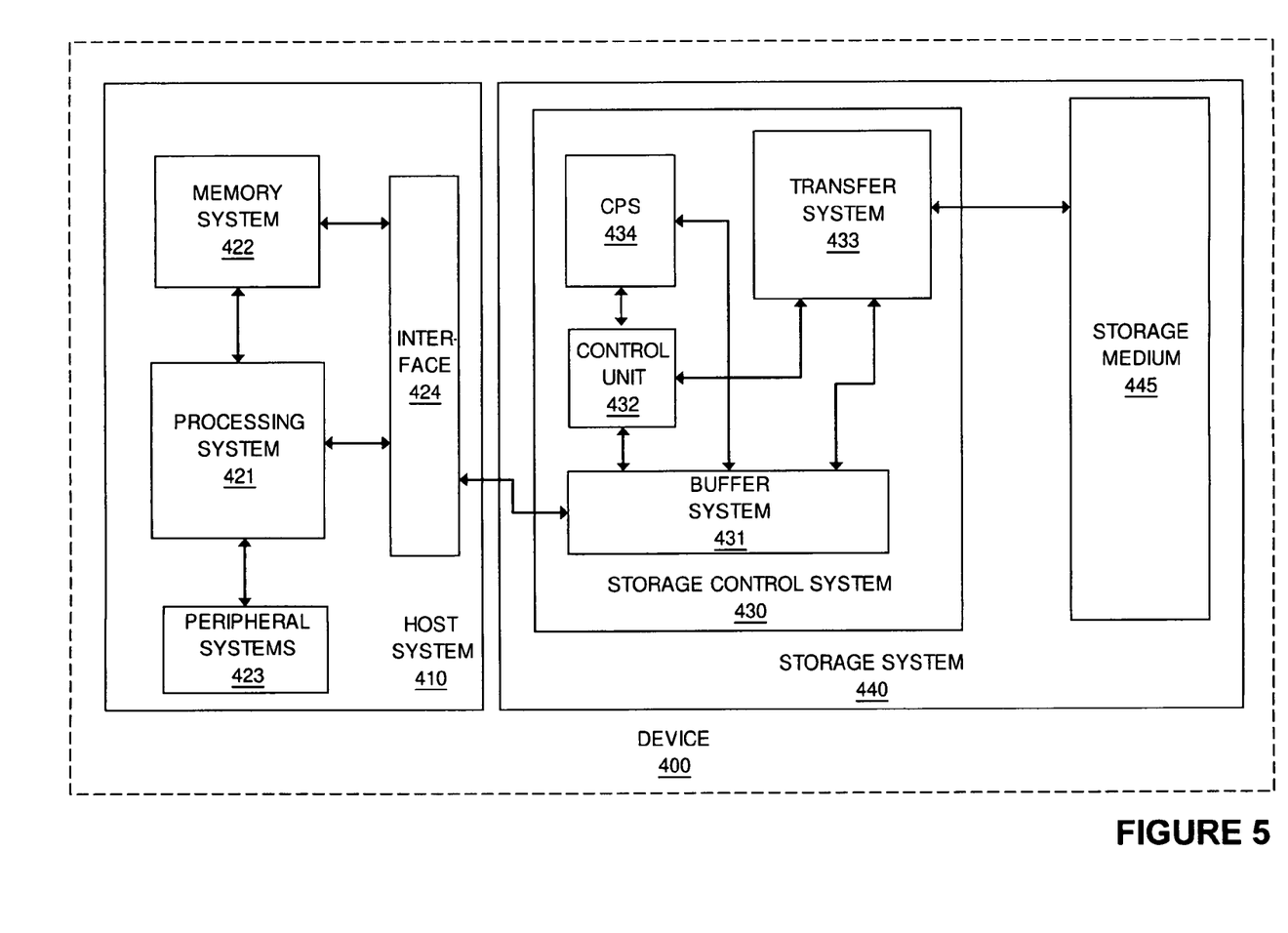
FIG. 5 illustrates a device in an embodiment of the invention.

In a read scenario, transfer system 433 reads from storage medium 445 a data segment and the ECC associated with the data segment. Transfer system 433 passes the ECC and data segment to buffer system 431. CPS 434 processes the data segment with the ECC to generate a first result. CPS 434 then processes the first result with the hard coded identifier to generate a second result. The second result identifies possible errors in the data segment. CPS 434 then corrects the data segment using the second result. If host system 410 is the host system bonded to the data segment, the resulting corrected data segment could be valid and useful for the operating system or application programs running on host system 410. If not, the resulting corrected data segment could be rendered largely damaged and useless. FIG. 5 illustrates device 400, except that in FIG. 5, storage control system 430 resides on storage system 440.

It should be understood that other digital content protection systems or schemes could be implemented along with the content protection described above. For instance, digital content could be encrypted prior to the ECC generation process. It should also be understood that the ECC process could be seeded with other elements, such as a logical block address, in addition to seeding with a hard coded identifier. It should also be understood that the content protection systems described above could include an encryption module. The encryption module could use the hard coded identifier to encrypt data segments in addition to the ECC process.

Advantageously, embodiments of the invention protect digital content by processing and storing digital content in a manner so as to link the stored content to a particular host system. In particular, a hard coded identifier is used to seed an ECC process. The resulting ECCs that are stored with data segments are inherently linked to the hard coded identifier, which resides permanently on the host system. When content is retrieved from a storage system by a host system, the retrieval could succeed if the host system is the same host system that initially provided the content to the storage system for storage. If not, the retrieval process could fail.

What is claimed is:

1. An integrated circuit comprising:
   an input module configured to receive a first data segment;
   an identifier module having a hard coded identifier;
   a processing module coupled to the input module and coupled to the identifier module and configured to process the first data segment with the hard coded identifier to generate a first encoded data segment;
   an output module configured to transfer the first encoded data segment for storage on a storage system;
   wherein the input module is configured to receive a second encoded data segment from the storage system; and
   wherein the processing module is configured to process the second encoded data segment with the hard coded identifier to decode the second encoded data segment.

2. The integrated circuit of claim 1 wherein the identifier module comprises a plurality of inputs connected to the processing module wherein the hard coded identifier is identified by setting the plurality of inputs during a manufacturing process.

3. The integrated circuit of claim 2 wherein the plurality of inputs comprise a plurality of pins.

4. The integrated circuit of claim 2 wherein the plurality of inputs comprise a plurality of fuses.

5. The integrated circuit of claim 2 wherein the plurality of inputs comprise a plurality of electrical inputs.

6. The integrated circuit of claim 5 wherein the plurality of electrical inputs comprise a plurality of current inputs.

7. The integrated circuit of claim 5 wherein the plurality of electrical inputs comprise a plurality of voltage inputs.

8. A method of operating an integrated circuit comprising an input module, an output module, and a processing module coupled to the input module and the output module, the method comprising:
   in the input module, receiving a first data segment;
   in the processing module, reading a hard coded identifier from an identifier module coupled to the processing module, processing the first data segment with the hard coded identifier to generate a first encoded data segment;
   in the output module, transferring the first encoded data segment for storage on a storage system;
   in the input module, receiving a second encoded data segment; and
   in the processing module, processing the second encoded data segment with the hard coded identifier to decode the second encoded data segment.

9. The method of claim 8 wherein the identifier module comprises a plurality of inputs connected to the processing module wherein the hard coded identifier is identified by setting the plurality of inputs during a manufacturing process.

10. The method of claim 9 wherein the plurality of inputs comprise a plurality of pins.

11. The method of claim 9 wherein the plurality of inputs comprise a plurality of fuses.

12. The integrated circuit of claim 9 wherein the plurality of inputs comprise a plurality of electrical inputs.

13. The integrated circuit of claim 12 wherein the plurality of electrical inputs comprise a plurality of current inputs.

14. The integrated circuit of claim 12 wherein the plurality of electrical inputs comprise a plurality of voltage inputs.

15. A device comprising:
   a storage medium; and
   a host system having a plurality of system elements and a storage control system for controlling data transfer between the plurality of system elements and the storage medium, the storage control system comprising:
   a content protection system configured to receive a first data segment from a one of the plurality of system elements, read a hard coded identifier, process the first data segment with the hard coded identifier to generate a first encoded data segment, transfer the first encoded data segment for storage on the storage medium; and a transfer system configured to transfer the first encoded data segment to the storage medium; and wherein the content protection system is further configured to receive a second encoded data segment and process the second encoded data segment with the hard coded identifier to decode the second encoded data segment.

* * * * *